US012622038B2

(12) United States Patent
Wang et al.

(10) Patent No.: US 12,622,038 B2
(45) Date of Patent: May 5, 2026

(54) MV DEVICE AND METHOD FOR MANUFACTURING SAME

(71) Applicant: Shanghai Huali Integrated Circuit Corporation, Shanghai (CN)

(72) Inventors: Qiwei Wang, Shanghai (CN); Tao Liu, Shanghai (CN); Haoyu Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 365 days.

(21) Appl. No.: 18/457,141

(22) Filed: Aug. 28, 2023

(65) Prior Publication Data

US 2024/0096992 A1 Mar. 21, 2024

(30) Foreign Application Priority Data

Sep. 16, 2022 (CN) .......................... 202211129333.5

(51) Int. Cl.
| | |
|---|---|
| *H01L 29/423* | (2006.01) |
| *H01L 29/78* | (2006.01) |
| *H10D 30/01* | (2025.01) |
| *H10D 30/60* | (2025.01) |
| *H10D 64/01* | (2025.01) |
| *H10D 64/27* | (2025.01) |

(52) U.S. Cl.
CPC ......... *H10D 64/519* (2025.01); *H10D 30/022* (2025.01); *H10D 30/601* (2025.01); *H10D 64/01* (2025.01)

(58) Field of Classification Search
None
See application file for complete search history.

(56) References Cited

U.S. PATENT DOCUMENTS

2018/0012970 A1* 1/2018 Kim ..................... H10D 62/151

* cited by examiner

*Primary Examiner* — Asok K Sarkar
(74) *Attorney, Agent, or Firm* — Banner & Witcoff, Ltd.

(57) ABSTRACT

An MV device is disclosed. A gate conductive material layer is segmented into a body gate conductive material layer and two edge gate conductive material layers along a channel length direction. The two edge gate conductive material layers are located on two sides of the body gate conductive material layer and are spaced apart from the body gate conductive material layer by dielectric segmentation structures. The lightly doped drain regions extend under the first side face and the second side face of the gate conductive material layer, to reach under the body gate conductive material layer, such that the channel region becomes located under the body gate conductive material layer; and the edge gate conductive material layers and the dielectric segmentation structures become located above the lightly doped drain regions. The present disclosure also discloses a method for manufacturing an MV device.

8 Claims, 7 Drawing Sheets

MV DEVICE AND METHOD FOR MANUFACTURING SAME

CROSS-REFERENCES TO RELATED APPLICATIONS

This application claims the priority to Chinese patent application No. 202211129333.5, filed on Sep. 16, 2022, and entitled "MV DEVICE AND METHOD FOR MANUFAC-TURING SAME", the disclosure of which is incorporated herein by reference in entirety.

TECHNICAL FIELD

The present disclosure relates to the field of semiconduc-tor integrated circuit manufacturing, in particular to a medium voltage (MV) device. The present disclosure also relates to a method for manufacturing an MV device.

BACKGROUND

The high voltage (HV) IC device manufacturing process at the 28 nm note platform includes inserting medium and high voltage devices, i.e., a medium voltage device and a high voltage device, on a 28 nm HK platform. After inserting the medium and high voltage devices, a low voltage (LV) device, a medium voltage device, and a high voltage device are integrated together on the same semiconductor substrate. For example, a core device or SRAM device includes the LV device, and an input output (IO) device includes the medium voltage device. A working voltage of the LV device reaches a few tenths of a volt or one plus a few tenths of a volt, a working voltage of the medium voltage device reaches several volts, such as 8V, and a working voltage of the high voltage device is higher. The provision of a field oxide is typically required in a drift region of the high voltage device. In an integrated process, the medium voltage device and the core/SRAM device share the same gate spacer, for example, an 8V MV and a 0.9V core/SRAM share the same spacer. Due to hard constraints of a pitch of the SRAM, the gate spacer cannot be too thick. In the present application, the thickness of the spacer refers to a lateral width of the gate spacer. As the result, a gate induced drain leakage (GIDL) in the MV device is severe.

Currently, in the industry, ways to improve the GIDL are mainly by adjusting a lightly doped drain (LDD) region of the MV device, but the improvement is limited with a very small process window.

FIGS. 1A-1D are schematic diagrams of cross sectional structures in various steps of an existing method for manu-facturing an MV device. The existing method for manufac-turing an MV device includes the following steps:

Step 1. Referring to FIG. 1A, a semiconductor substrate 101 is provided, wherein two lightly doped drain regions 102 are formed in selected regions of the semiconductor substrate 101.

A channel region 103 is located in a surface region of the semiconductor substrate 101 between the two lightly doped drain regions 102.

Typically, a field oxide layer such as a shallow trench isolation (STI) is also formed on the semiconductor sub-strate 101. The field oxide layer isolates an active region, that is, a region of the semiconductor substrate 101 sur-rounded by the field oxide layer forms the active region. A formation region of the MV device is located in a first active region 101a, and the first active region 101a is composed of the semiconductor substrate 101 in the region surrounded by the field oxide layer. Typically, an HV device and an LV device are integrated simultaneously on the semiconductor substrate 101, and formation regions of the HV device and the LV device are located in respective active regions.

Step 2. Referring to 1A, a gate dielectric layer 104 is formed on a surface of the semiconductor substrate 101.

The grown gate dielectric layer 104 covers the entire surface of the semiconductor substrate 101. Typically, after the growth of the gate dielectric layer 104, a patterned etching process is required to retain the gate dielectric layer 104 in only the first active region 101a. The gate dielectric layer 104 in the formation regions of the HV device and the LV device needs to be removed. Formation processes of the HV device and LV device are not described in detail in the description of the present application.

Step 3. Referring to FIG. 1A, a gate conductive material layer 105 is grown.

A first patterned etching is performed to form on the gate conductive material layer 105, and the first patterned etching forms all side faces of the gate conductive material layer 105. The gate conductive material layer 105 is located in only a formation region of a gate structure after the first patterned etching.

A first side face and a second side face of the gate conductive material layer 105 are two side faces located in a channel length direction.

A third side face and a fourth side face of the gate conductive material layer 105 are two side faces located in a channel width direction.

In FIG. 2, the channel length direction corresponds to a horizontal direction in a plane shown in FIG. 2, and the channel width direction corresponds to a vertical direction in the plane shown in FIG. 2.

Step 4. Referring to FIG. 1B, a spacer process is per-formed to form spacers 106 on all the side faces of the gate conductive material layer 105.

The spacer process includes deposition of a spacer dielec-tric layer and a full etching process.

Step 5. Referring to FIG. 1C, the gate dielectric layer 104 is etched using the spacers 106 as a self-alignment condition, so that a side face of the gate dielectric layer 104 is aligned with a side face of the spacers 106.

Step 6. Referring to FIG. 1D, a self-aligned source drain injection is performed to form source drain implantation regions 107 on surfaces of the lightly doped drain regions 102 outside the spacers 106 at a first side face and a second side face of the gate structure.

FIG. 2 is a schematic diagram of a top view structure of the MV device shown in FIG. 1D, that is, FIG. 2 is a layout of the MV device made from the existing method. The spacers 106 typically are formed simultaneously with spac-ers of the LV device, and a pitch of the LV device is usually reduced, resulting in a thinner thickness of the spacers 106, and thereby leading to poor GIDL leakage performance of the MV device.

BRIEF SUMMARY

According to some embodiments in this application, an MV device provided by the present disclosure includes:

a gate structure, wherein the gate structure comprises a gate dielectric layer disposed on a surface of a semi-conductor substrate, a gate conductive material layer disposed on a surface of the gate dielectric layer, and a channel region disposed under the gate dielectric layer;

spacers, disposed on a first side face and a second side face of the gate conductive material layer in a self-aligned manner, wherein the first side face and the second side face of the gate conductive material layer are disposed along the channel length direction of the channel region;

lightly doped drain regions, disposed in the semiconductor substrate and outside the first side face and the second side face of the gate conductive material layer; and source drain implantation regions, disposed on surfaces of the lightly doped drain regions away from the spacers of the gate conductive material layer.

The gate conductive material layer is segmented into a body gate conductive material layer and edge gate conductive material layers along the channel length direction.

The body gate conductive material layer is located in a middle region, wherein the edge gate conductive material layers are located on two sides of the body gate conductive material layer, and are spaced apart from the body gate conductive material layer by dielectric segmentation structures.

Each of the first side face and the second side face of the gate conductive material layer is an outer surface of one of the edge gate conductive material layers.

The channel region is located between the lightly doped drain regions in the surface of the semiconductor substrate.

In some cases, the dielectric segmentation structures are each composed of a dielectric layer filling a segmentation trench.

The segmentation trench is formed by etching the gate conductive material layer via a patterned etching process on each side face of the gate structure.

In some cases, the dielectric layer of the dielectric segmentation structure comprises a first dielectric layer, wherein the first dielectric layer and the spacers are formed in a simultaneous process.

In some cases, the width of the segmentation trench is less than or equal to twice the thickness of a bottom of one spacer, and wherein the first dielectric layer fills the segmentation trench;

Alternatively, the width of the segmentation trench is greater than twice the thickness of the bottom of the spacer, wherein the first dielectric layer does not fully fill the segmentation trench, and wherein the dielectric segmentation structure further comprises a second dielectric layer, wherein the second dielectric layer and the first dielectric layer together fill the segmentation trench.

In some cases, the first dielectric layer is an oxide layer, a nitride layer, or a stack layer of an oxide layer and a nitride layer.

The second dielectric layer is an oxide layer, a nitride layer, or a stack layer of an oxide layer and a nitride layer.

Materials of the first dielectric layer and the second dielectric layer are the same or different.

In some cases, a formation region of the MV device is located in a first active region, and the first active region is composed of the semiconductor substrate in a region surrounded by a field oxide layer.

A third side face and a fourth side face of the gate conductive material layer are two side faces located in a channel width direction, and along the channel width direction, the third side face and the fourth side face of the gate conductive material layer also extend to the top of the field oxide layer outside the first active region separately.

In some cases, a material of the gate dielectric layer comprises an oxide layer.

In some cases, a material of the gate conductive material layer comprises polysilicon.

In order to solve the above technical problem, the method for manufacturing an MV device provided by the present disclosure includes the following steps:

step 1, providing a semiconductor substrate, forming two lightly doped drain regions in selected regions of the semiconductor substrate;

forming a channel region in a surface of the semiconductor substrate between the two lightly doped drain regions;

step 2, forming a gate dielectric layer on the surface of the semiconductor substrate;

step 3, growing a gate conductive material layer on a surface of the gate dielectric layer;

performing a first patterning on the gate conductive material layer to form side faces on the gate conductive material layer and a segmentation trench on each side; and dividing the gate conductive material layer into a body gate conductive material layer and two edge gate conductive material layers along a channel length direction, wherein the body gate conductive material layer is located in a middle region, the two edge gate conductive material layers are located on two sides of the body gate conductive material layer, and wherein the two edge gate conductive material layers each is spaced apart from the body gate conductive material layer by the segmentation trench;

wherein a first side face and a second side face of the gate conductive material layer are outer surfaces of the edge gate conductive material layers and located along the channel length direction;

wherein the lightly doped drain regions extend under the first side face and the second side face of the gate conductive material layer, to reach under the body gate conductive material layer, such that the channel region becomes located under the body gate conductive material layer; and wherein the edge gate conductive material layers and the dielectric segmentation structures become located above the lightly doped drain regions;

step 4, forming spacers on side faces of the gate conductive material layer;

step 5, filling each of the segmentation trench with a dielectric segmentation structure; and step 6, forming source drain implantation regions in a self-aligned process on surfaces of the lightly doped drain regions outside the spacers away from the first side face and the second side face of the gate conductive material layer.

In some cases, in step 5, the dielectric segmentation structure comprises a first dielectric layer of the spacers, wherein the first dielectric layer is made in a same process as the spacers are made in step 4.

In some cases, wherein a width of the segmentation trench is less than or equal to twice aa thickness of a bottom of the spacer, and wherein the first dielectric layer fills the segmentation trench to form the dielectric segmentation structure, and wherein step 4 and step 5 are implemented together.

In some cases, the width of the segmentation trench is greater than twice a thickness of a bottom of the spacer, wherein the first dielectric layer does not fully fill the segmentation trench and leaves a gap in the segmentation trench, and wherein step 5 further comprises: forming a second dielectric layer to fill the gap of the segmentation trench, wherein the first dielectric layer and the second dielectric layer are stacked in the segmentation trench.

In some cases, forming the second dielectric layer in step 5 is implemented after step 6; wherein the method further comprises fully filling the gap of the segmentation trench with a photoresist before step 6, and then performing step 6, followed by removing the photoresist from the segmentation trench.

In some cases, the first dielectric layer is an oxide layer, a nitride layer, or a stack layer of an oxide layer and a nitride layer.

The second dielectric layer is an oxide layer, a nitride layer, or a stack layer of an oxide layer and a nitride layer.

Materials of the first dielectric layer and the second dielectric layer are the same or different.

In some cases, a material of the gate dielectric layer comprises an oxide layer.

In some cases, a material of the gate conductive material layer comprises polysilicon.

Regarding the technical problem of the limited thickness of the spacers in the MV device, which is easy to cause a leakage such as a GIDL leakage, the present disclosure improves a process structure of the gate conductive material layer of the gate structure of the MV device. Along the channel length direction, the gate conductive material layer is segmented into the body gate conductive material layer located in the middle region and the edge gate conductive material layers located on the two sides of the body gate conductive material layer by means of the dielectric segmentation structures. The lightly doped drain regions extend laterally to a bottom region of the body gate conductive material layer, that is, the lightly doped drain regions overlap the body gate conductive material layer. As such, the entire region of the channel region between the lightly doped drain regions is covered by the body gate conductive material layer. Therefore, the introduction of the dielectric segmentation structures does not affect the conductivity of the channel region of the device, thereby maintaining a speed of the MV device.

The edge gate conductive material layers and the dielectric division structures are all located in top regions of the lightly doped drain regions, i.e., located in overlap regions of the lightly doped drain regions and the entire gate conductive material layer. As such, the thickness of an isolation layer between the body gate conductive material layer and the source drain implantation region is increased, which is equivalent to increasing the thickness of the spacers. Therefore, an electric field near the source drain implantation region is gentle, thus reducing a leakage current of the MV device, e.g., reducing a GIDL leakage current.

The dielectric segmentation structures of the present disclosure may be achieved by the dielectric layer filling the segmentation trench. The segmentation trench may be formed simultaneously with all the side faces of the gate conductive material layer during a first patterned etching process of the gate conductive material layer, thus requiring no additional lithography process for definition. Moreover, the dielectric layer filling the segmentation trench may also be achieved using the dielectric layer of the spacer process or by stacking the second dielectric layer on the dielectric layer of the spacer process. The second dielectric layer may also be conveniently integrated into a formation process of the dielectric layer following the source drain injection. Accordingly, the dielectric segmentation structures of the present disclosure require no additional process costs. Therefore, the present disclosure also has the advantages of a simple integration process and low process costs.

In addition, the present disclosure can also reduce a gate source capacitance and a gate drain capacitance.

BRIEF DESCRIPTION OF THE DRAWINGS

The present disclosure is further described in detail below in conjunction with the drawings and specific implementations:

FIGS. 3A-3D are schematic diagrams of cross sectional structures obtained at various steps of a method for manufacturing an MV device according to an embodiment of the present disclosure.

DETAILED DESCRIPTION OF THE DISCLOSURE

Figure 3A:
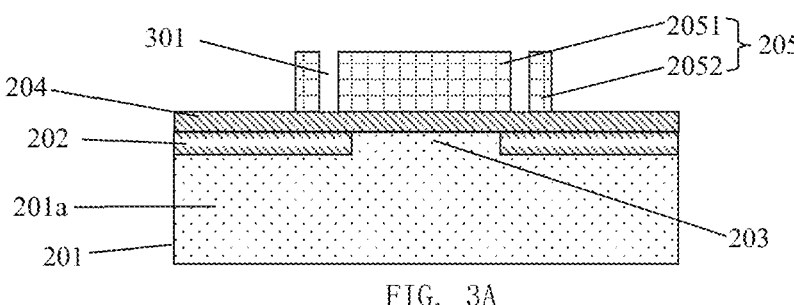
Figure 3B:
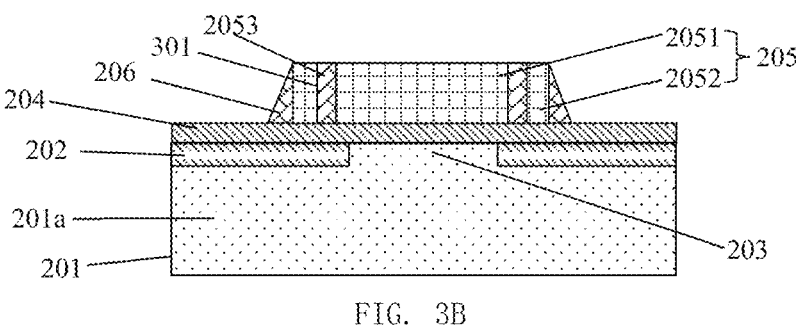
Figure 3D:
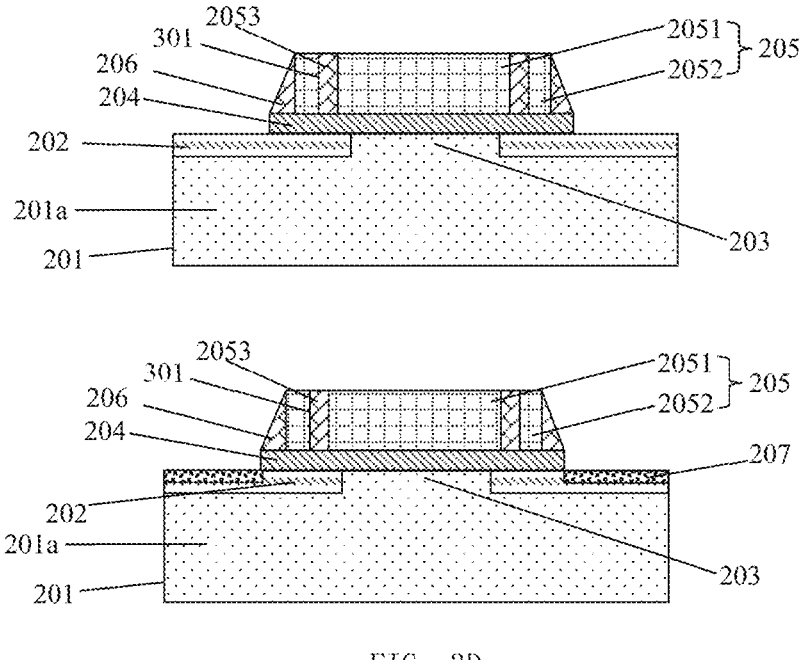
Figure 4:
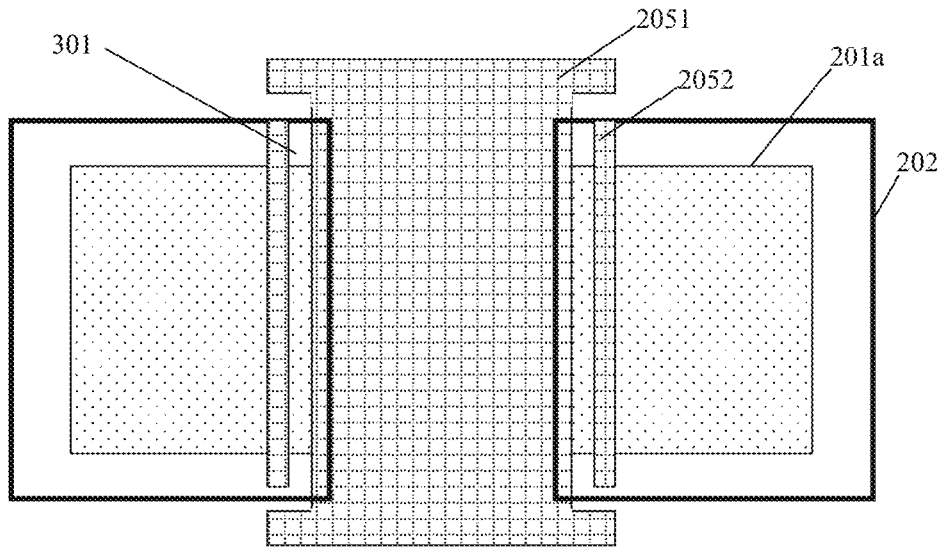
FIG. 4 is a schematic diagram of a top view structure of the MV device according to an embodiment of the present disclosure.

FIG. 3D is a schematic diagram of a cross sectional structure of an MV device of an embodiment of the present disclosure. FIG. 4 is a schematic diagram of a top view structure of the MV device of an embodiment of the present disclosure. The MV device of this embodiment of the present disclosure includes:

a gate structure, the gate structure formed by stacking a gate dielectric layer 204 formed on a surface of a semiconductor substrate 201 and a gate conductive material layer 205.

In this embodiment of the present disclosure, a material of the gate dielectric layer 204 includes an oxide layer.

A material of the gate conductive material layer 205 includes polysilicon.

Spacers 206 are formed on all side faces of the gate conductive material layer 205 in a self-aligned manner. A first side face and a second side face of the gate conductive material layer 205 are two side faces located in a channel length direction. The cross sectional structure in FIG. 3D is a cross sectional structure along the channel length direction, so the two side faces of the gate conductive material layer 205 shown in FIG. 3D are the first side face and the second side face.

In this embodiment of the present disclosure, the gate dielectric layer 204 at the bottom of the spacers 206 is retained. In other embodiments, a side face of the gate dielectric layer 204 is directly aligned with a corresponding side face of the gate conductive material layer 205 at the top thereof, and the spacers 206 cover side faces of the gate dielectric layer 204.

Lightly doped drain regions 202 are formed in the semiconductor substrate 201 outside the first side face and the second side face of the gate conductive material layer 205.

Source drain implantation regions 207 are formed on surfaces of the lightly doped drain regions 202 outside the spacers 206 at the first side face and the second side face of the gate conductive material layer 205. In FIG. 3D, the source drain implantation regions 207 on two sides of the gate structure present a symmetrical structure, with one serving as a source region and the other as a drain region. The source region and the drain region are both represented by a mark 207.

The gate conductive material layer 205 is segmented into a body gate conductive material layer 2051 and edge gate conductive material layers 2052 along the channel length direction. The body gate conductive material layer 2051 is located in a middle region, the edge gate conductive material layers 2052 are located on two sides of the body gate conductive material layer 2051, and the edge gate conductive material layers 2052 are spaced apart from the body gate conductive material layer 2051 by dielectric segmentation structures 2053.

The first side face and the second side face of the gate conductive material layer 205 are composed of outer side faces of the edge gate conductive material layers 2052 on the two sides of the body gate conductive material layer 2051.

A channel region 203 is located in a surface region of the semiconductor substrate 201 between the lightly doped drain regions 202 on the two sides of the gate structure.

At the first side face and the second side face of the gate conductive material layer 205, the lightly doped drain regions 202 also extend to the bottom of the body gate conductive material layer 2051. An entire region of the channel region 203 is covered by the body gate conductive material layer 2051, and the edge gate conductive material layers and the dielectric segmentation structures are all located at the top of the lightly doped drain regions 202. As such, the top of the channel region 203 is not covered by the dielectric segmentation structures 2053, so the channel conductivity of the MV device is not affected. Since the dielectric segmentation structure 2053 is located in an edge region of the top of the lightly doped drain regions 202, which is equivalent to increasing the thickness of the spacers 206, a leakage such as a GIDL leakage of the device may be reduced. The thickness of the spacers 206 refers to a lateral width of the spacers 206.

In this embodiment of the present disclosure, the dielectric segmentation structures 2053 are each composed of a dielectric layer filling a segmentation trench 301.

The segmentation trench 301 is formed by etching the gate conductive material layer 205 via a patterned etching process on each side face of the gate structure. Therefore, the formation of the segmentation trench 301 requires no additional process costs.

The dielectric layer of the dielectric segmentation structure 2053 includes a first dielectric layer, and process structures of the first dielectric layer and a dielectric layer of the spacers 206 are the same and formed simultaneously. As such, a formation process of the first dielectric layer of the dielectric segmentation structure 2053 likewise requires no additional costs.

In some embodiments, the width of the segmentation trench 301 is less than or equal to twice the thickness of the bottom of dielectric layer of the spacers 206, the first dielectric layer fully fills the segmentation trench 301, and the dielectric layer of the dielectric segmentation structure 2053 is composed of the first dielectric layer.

Alternatively, in other embodiments, the width of the segmentation trench 301 is greater than twice the thickness of the bottom of dielectric layer of the spacers 206, the first dielectric layer does not fully fill the segmentation trench 301, the dielectric layer of the dielectric segmentation structure 2053 further includes a second dielectric layer, and the second dielectric layer and the first dielectric layer fully fill the segmentation trench 301 jointly. The second dielectric layer may be formed separately or formed simultaneously with film layers such as an interlayer film in a subsequent interconnection process.

The first dielectric layer is an oxide layer, a nitride layer, or a stack layer of an oxide layer and a nitride layer.

The second dielectric layer is an oxide layer, a nitride layer, or a stack layer of an oxide layer and a nitride layer.

Materials of the first dielectric layer and the second dielectric layer are the same or different.

In this embodiment of the present disclosure, a formation region of the MV device is located in a first active region 201*a*, and the first active region 201*a* is composed of the semiconductor substrate 201 in a region surrounded by a field oxide layer. Typically, an HV device and an LV device are integrated simultaneously on the semiconductor substrate 201, and formation regions of the HV device and the LV device are located in respective active regions. Each of the active regions is also composed of the semiconductor substrate 201 in a region surrounded by the field oxide layer.

Referring to FIG. 4, a third side face and a fourth side face of the gate conductive material layer 205 are two side faces located in a channel width direction, and along the channel width direction, the third side face and the fourth side face of the gate conductive material layer 205 also extend to the top of the field oxide layer outside the first active region 201*a* separately. In FIG. 4, the channel length direction is a horizontal direction in a plane shown in FIG. 4, and the channel width direction is a vertical direction in the plane shown in FIG. 4.

Figure 4A:
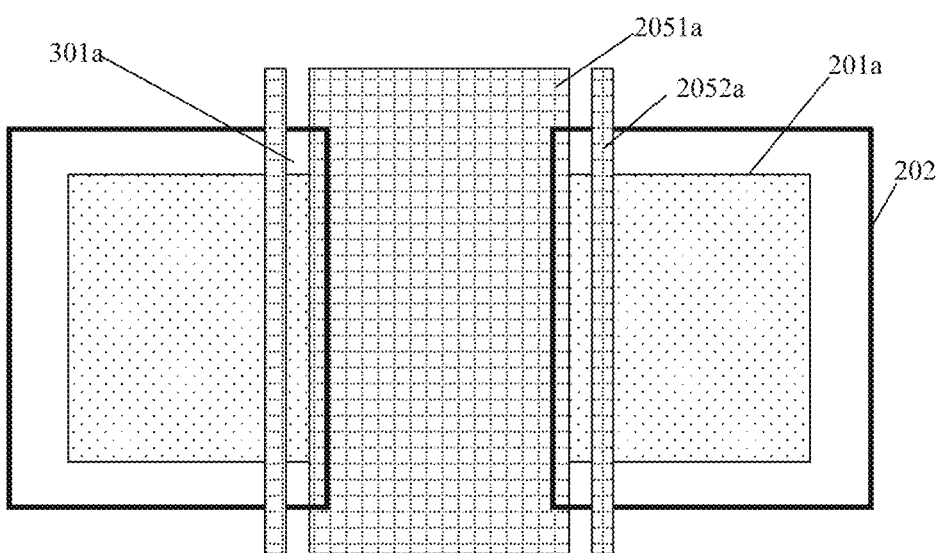
FIG. 4A is a schematic diagram of a top view structure of the MV device according to another embodiment of the present disclosure.

FIG. 4 only shows a schematic diagram of one top view structure of the MV device of this embodiment of the present disclosure. In other embodiments, under the condition of ensuring full separation of the body gate conductive material layer 2051 from the edge gate conductive material layers 2052, a layout structure of the segmentation trench 301 may vary based on FIG. 4. FIG. 4A is a schematic diagram of a top view structure of the MV device in another embodiment of the present disclosure. In FIG. 4A, the body gate conductive material layer is represented separately by a mark 2051*a*, the edge gate conductive material layers are represented separately by a mark 2052*a*, and the segmentation trench is represented separately by a mark 301*a*. It can be seen that, compared to the layout structure of the segmentation trench 301 in FIG. 4, there is a change in the layout structure of the segmentation trench 301 in FIG. 4A, mainly a change in a structure of the field oxide layer outside the first active region 201*a*, However, the dividing groove 301*a* may also fully separate the body gate conductive material layer 2051*a* from the edge gate conductive material layers 2052*a*. Therefore, the layout structure shown in FIG. 4A is also applicable to the present application.

Regarding the technical problem of the limited thickness of the spacers 206 in the MV device, which is easy to cause a leakage such as a GIDL leakage, this embodiment of the present disclosure improves a process structure of the gate conductive material layer 205 of the gate structure of the MV device. Along the channel length direction, the gate conductive material layer 205 is segmented into the body gate conductive material layer 2051 located in the middle region and the edge gate conductive material layers 2052 located on the two sides of the body gate conductive material layer 2051 by means of the dielectric segmentation structures 2053. The lightly doped drain regions 202 extend laterally to a bottom region of the body gate conductive material layer, that is, the lightly doped drain regions 202 overlap the body gate conductive material layer. As such, the entire region of the channel region 203 between the lightly doped drain regions 202 is covered by the body gate conductive material layer. Therefore, the introduction of the dielectric segmentation structures 2053 does not affect the conductivity of the channel region 203 of the device, thereby maintaining a speed of the MV device.

The edge gate conductive material layers 2052 and the dielectric division structures 2053 are all located in top regions of the lightly doped drain regions 202, i.e., located in overlap regions of the lightly doped drain regions 202 and the entire gate conductive material layer 205. As such, the thickness of an isolation layer between the body gate conductive material layer 2051 and the source drain implantation region 207 is increased, which is equivalent to increasing the thickness of the spacers 206. Therefore, an electric field near the source drain implantation region 207 is gentle, thus reducing a leakage current of the MV device, e.g., reducing a GIDL leakage current.

The dielectric segmentation structures 2053 of this embodiment of the present disclosure may be achieved by the dielectric layer filling the segmentation trench 301. The segmentation trench 301 may be formed simultaneously with all the side faces of the gate conductive material layer 205 during a first patterned etching process of the gate conductive material layer 205, thus requiring no additional lithography process for definition. Moreover, the dielectric layer filling the segmentation trench 301 may also be achieved using the dielectric layer of the spacer process or by stacking the second dielectric layer on the dielectric layer of the spacer process. The second dielectric layer may also be conveniently integrated into a formation process of the dielectric layer following the source drain injection. Accordingly, the dielectric segmentation structures 2053 of this embodiment of the present disclosure require no additional process costs. Therefore, this embodiment of the present disclosure also has the advantages of a simple integration process and low process costs.

In addition, this embodiment of the present disclosure can also reduce a gate source capacitance and a gate drain capacitance.

Figure 5A:
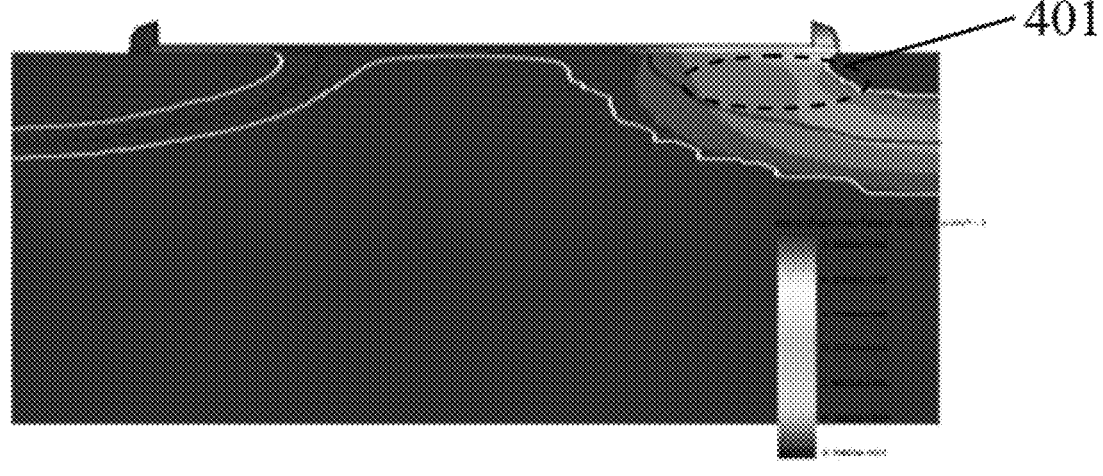
FIG. 5A is a simulation data of an electric field intensity distribution of the MV device made with the existing method.
Figure 5B:
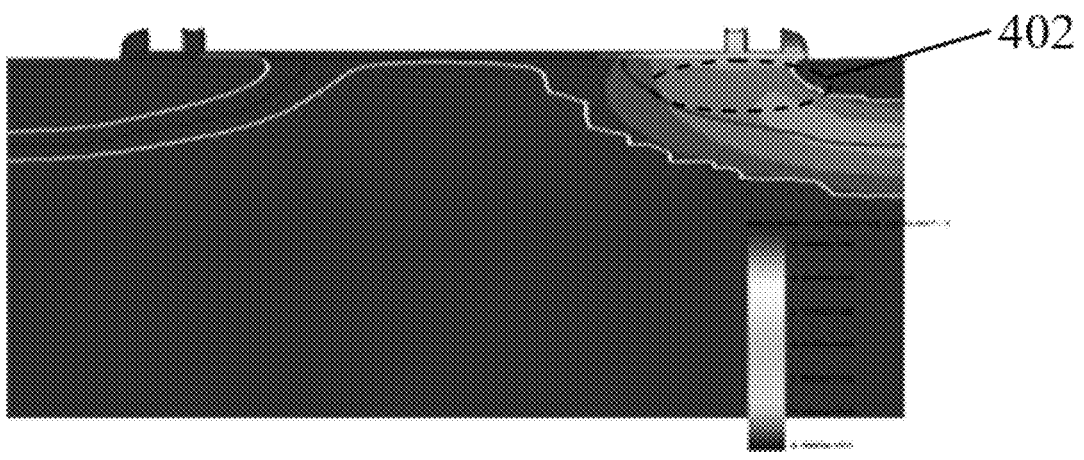
FIG. 5B is a an embodiment of the present disclosure.

FIG. 5A is a simulation data of an electric field intensity distribution of the MV device made with the existing method. FIG. 5B is a simulation data of an electric field intensity distribution of the MV device made with the method according to this embodiment of the present disclosure. In FIG. 5A and FIG. 5B, the simulation data are represented in greyscale colors, with the greyscale representing different electric field intensities. A region near the drain region in FIG. 5A is a region shown in a dashed line oblate 401, and a region near the drain region in FIG. 5B is a region shown in a dashed line oblate 402. The comparison shows that the electric field intensity distribution in the dashed line oblate 402 has good continuity, a smaller change magnitude, and a smoother change, leading to a reduction in the leakage of device.

Figure 1A:
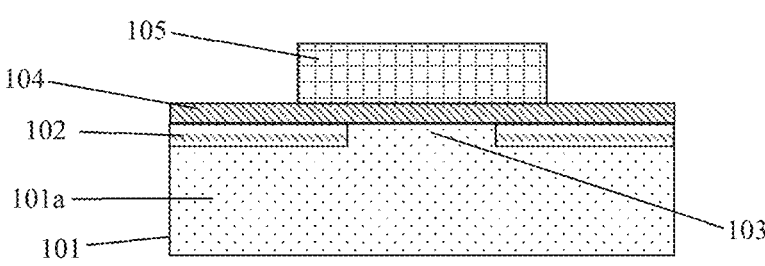
FIGS. 1A-1D are schematic diagrams of cross sectional structures obtained at various steps of an existing method for manufacturing an MV device.
Figure 1B:
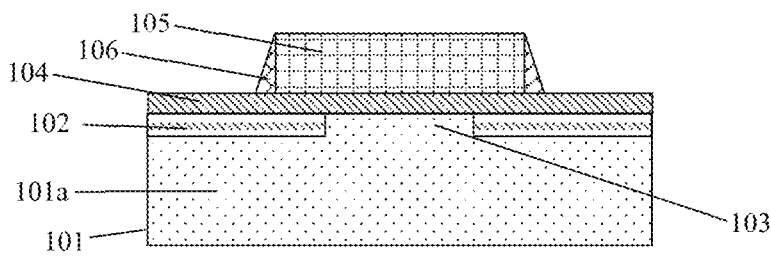
Figure 1C:
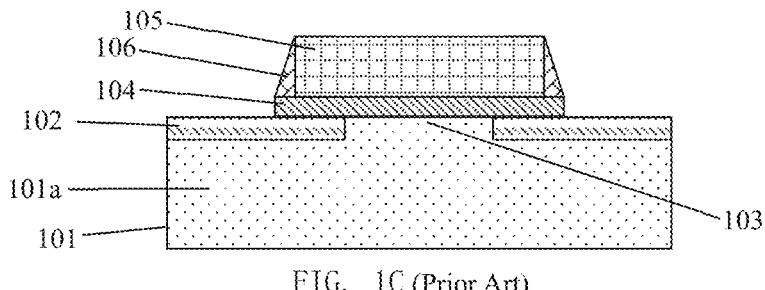
Figure 1D:
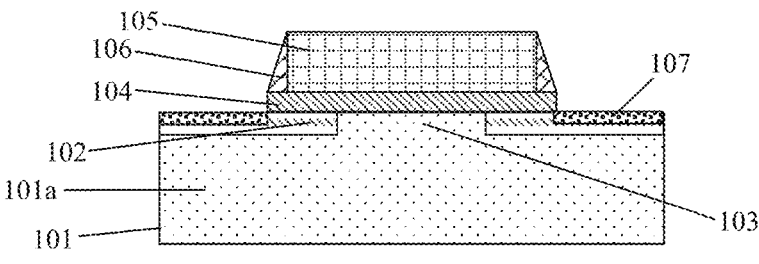
Figure 2:
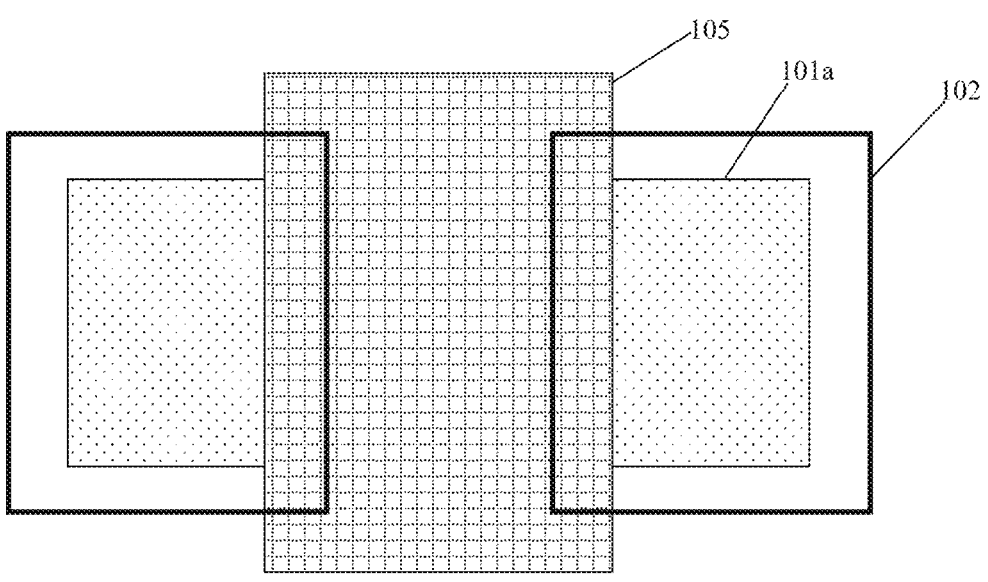
FIG. 2 is a schematic diagram of a top view structure of the MV device formed by the existing method for manufacturing an MV device.
Figure 6A:
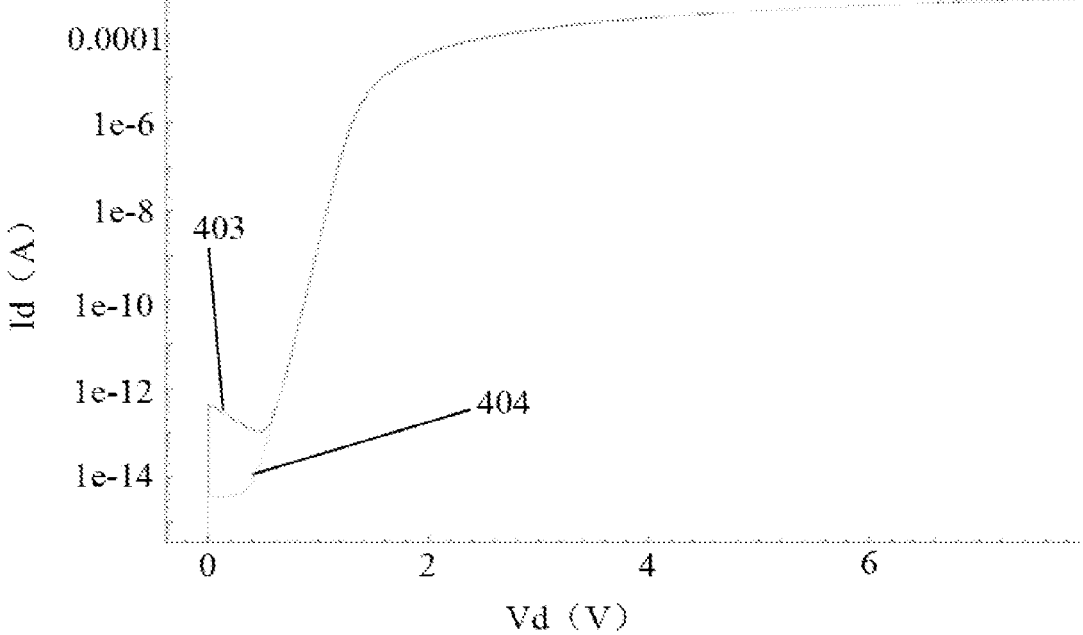
FIG. 6A is a chart comparing the switch-on output characteristic curves of an MV device made from the existing method and an MV made according to an embodiment of the present disclosure.

FIG. 6A is a chart comparing the switch-on output characteristic curves of an MV device made from the existing method and an MV made according to an embodiment of the present disclosure. The MV device made from the existing method adopts the structure shown in FIG. 1D. In FIG. 6A, the MV device of this embodiment of the present disclosure and the MV device made from the existing method are both NMOSs having the same working voltage of 8 V and having the same working condition, i.e., both having the same gate voltage, with sources being grounded and gate source voltages being greater than threshold voltages. An output characteristic curve is a curve of a drain current changing with a drain voltage. A curve 403 is a switch-on output characteristic curve of the MV device made from the existing method, and a curve 404 is a switch-on output characteristic curve of the MV device of this embodiment of the present disclosure. It can be seen that curves 403 and 404 substantially coincide, indicating that threshold voltages as well as protection currents of both MV devices are substantially the same and operation speeds thereof are also substantially the same.

Figure 6B:
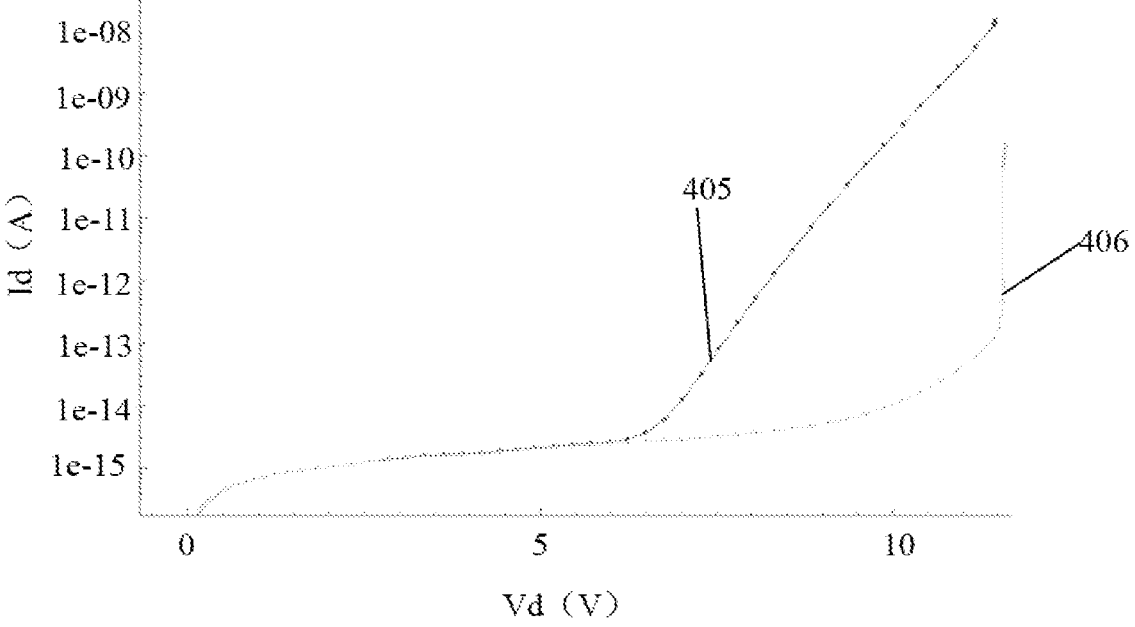
FIG. 6B is a chart comparing the switch-off output characteristic curves of an MV device made from the existing method and an MV made according to an embodiment of the present disclosure.

FIG. 6B is a chart comparing the switch-off output characteristic curves of an MV device made from the existing method and an MV made according to an embodiment of the present disclosure. In FIG. 6B, the MV device made from a method of this embodiment of the present disclosure and the MV device made from the existing method e have the same gate voltage, with the sources grounded and the gate source voltages being less than the threshold voltages. A curve 405 is a switch-off output characteristic curve of the MV device made from existing method, and a curve 406 is a switch-off output characteristic curve of the MV device of this embodiment of the present disclosure. It can be seen that as the drain voltage increases, a drain current of the curve 405 increases quickly. At about 8 V, the drain current of the curve 405 is increased significantly. A drain current at a switch-off moment is a leakage current, and such the leakage current is mainly a GIDL leakage current. Therefore, this embodiment of the present disclosure can reduce the GIDL leakage.

FIGS. 3A-3D are schematic diagrams of cross sectional structures in various steps of a method for manufacturing an MV device of this embodiment of the present disclosure. The method for manufacturing an MV device of this embodiment of the present disclosure includes the following steps:

Step 1. Referring to FIG. 3A, a semiconductor substrate 201 is provided, wherein two lightly doped drain regions 202 are formed in selected regions of the semiconductor substrate 201.

A channel region 203 is located in a surface region of the semiconductor substrate 201 between the two lightly doped drain regions 202.

In the method of this embodiment of the present disclosure, a field oxide layer such as a shallow trench isolation (STI) is also formed on the semiconductor substrate 201. The field oxide layer isolates an active region, that is, a region of the semiconductor substrate 201 surrounded by the field oxide layer forms the active region. A formation region of the MV device is located in a first active region 201a, and the first active region 201a is composed of the semiconductor substrate 201 in the region surrounded by the field oxide layer. Typically, an HV device and an LV device are integrated simultaneously on the semiconductor substrate 201, and formation regions of the HV device and the LV device are located in respective active regions.

Step 2. Referring to FIG. 3A, a gate dielectric layer 204 is formed on a surface of the semiconductor substrate 201.

The grown gate dielectric layer 204 covers the entire surface of the semiconductor substrate 201. Typically, after the growth of the gate dielectric layer 204, a patterned etching process is required to retain the gate dielectric layer

204 in only the first active region 201a. The gate dielectric layer 204 in the formation regions of the HV device and the LV device needs to be removed. Formation processes of the HV device and LV device are not described in detail in the description of the present application.

In the method of some embodiments, a material of the gate dielectric layer 204 includes an oxide layer.

Step 3. Referring to FIG. 3A, a gate conductive material layer 205 is grown.

In the method of some embodiments, a material of the gate conductive material layer 205 includes polysilicon.

A first patterned etching is performed on the gate conductive material layer 205, and the first patterned etching forms all side faces of the gate conductive material layer 205 and a segmentation trench 301 simultaneously.

The gate conductive material layer 205 is segmented into a body gate conductive material layer 2051 and edge gate conductive material layers 2052 along a channel length direction. The body gate conductive material layer 2051 is located in a middle region, the edge gate conductive material layers 2052 are located on two sides of the body gate conductive material layer 2051, and the edge gate conductive material layers 2052 are spaced apart from the body gate conductive material layer 2051 by the segmentation trench 301.

A first side face and a second side face of the gate conductive material layer 205 are two side faces located in the channel length direction and are composed of outer side faces of the edge gate conductive material layers 2052 on the two sides of the body gate conductive material layer 2051.

At the first side face and the second side face of the gate conductive material layer 205, the lightly doped drain regions 202 also extend to the bottom of the body gate conductive material layer 2051, an entire region of the channel region 203 is covered by the body gate conductive material layer 2051, and the edge gate conductive material layers 2052 and the segmentation trench 301 are all located at the top of the lightly doped drain regions 202.

Step 4. Referring to FIG. 3B, a spacer process is performed to form spacers 206 on all the side faces of the gate conductive material layer 205.

The spacer process includes deposition of a spacer dielectric layer and a full etching process.

Step 5. Referring to FIG. 3B, the segmentation trench 301 is filled with a dielectric layer to form a dielectric segmentation structure 2053.

In the method of this embodiment of the present disclosure, in step 5, the dielectric layer of the dielectric segmentation structure 2053 comprises a first dielectric layer, and the first dielectric layer is a dielectric layer of the spacers 206. A formation process of the first dielectric layer is merged into step 4 and uses the spacer process in step 4 for formation.

In some embodiments, the width of the segmentation trench 301 is less than or equal to twice the thickness of the bottom of dielectric layer of the spacers 206, and the first dielectric layer fully fills the segmentation trench 301 and constitutes the dielectric segmentation structure 2053. Step 4 and step 5 are combined and implemented together.

In the method of this embodiment of the present disclosure, the first dielectric layer is an oxide layer, a nitride layer, or a stack layer of an oxide layer and a nitride layer;

The second dielectric layer is an oxide layer, a nitride layer, or a stack layer of an oxide layer and a nitride layer.

Materials of the first dielectric layer and the second dielectric layer are the same or different.

In the method of this embodiment of the present disclosure, the method further includes: referring to FIG. 3C, etching the gate dielectric layer 204 using the spacers 206 as a self-alignment condition, so that a side face of the gate dielectric layer 204 is aligned with a side face of the spacers 206. In the method of other embodiments, the bottom gate dielectric layer 204 is also etched during the first patterned etching in step 3, so that the bottom of the segmentation trench 301 also penetrates through the gate dielectric layer 204. After the spacers 206 are formed, the spacers 206 cover side faces of the gate dielectric layer 204. After the filling, the dielectric segmentation structure 2053 also penetrates through the gate dielectric layer 204.

Step 6. A self-aligned source drain injection is performed to form source drain implantation regions 207 on surfaces of the lightly doped drain regions 202 outside the spacers 206 at the first side face and the second side face of the gate conductive material layer 205.

In other embodiments, the width of the segmentation trench 301 is greater than twice the thickness of the bottom of dielectric layer of the spacers 206. The first dielectric layer does not fully fill the segmentation trench 301 and forms a gap in the segmentation trench 301. Step 5 further includes:

forming a second dielectric layer to fully fill the gap of the segmentation trench 301, wherein the dielectric segmentation structure 2053 is formed by stacking the first dielectric layer and the second dielectric layer filling the segmentation trench 301.

In an improved method of other embodiment, a formation process of the second dielectric layer in step 5 is implemented after step 6. The method further includes fully filling the gap of the segmentation trench 301 using a photoresist before step 6, and then step 6 is performed, followed by removing the photoresist in the segmentation trench 301. The formation process of the second dielectric layer in step 5 may be implemented after step 6, and a deposition process of the dielectric layer after step 6 may be used to simultaneously form the second dielectric layer. For example, a deposition process of an interlayer film is used to form the second dielectric layer, thereby saving costs of the formation process of the second dielectric layer.

The present disclosure is described in detail above via specific embodiments, but these embodiments are not intended to limit the present disclosure. Without departing from the principle of the present disclosure, those skilled in the art can still make many variations and improvements, which should also be construed as falling into the protection scope of the present disclosure.

What is claimed is:

1. A method for manufacturing a medium voltage (MV) device, comprising:

step 1, providing a semiconductor substrate, forming two lightly doped drain regions in selected regions of the semiconductor substrate;

forming a channel region in a surface of the semiconductor substrate between the two lightly doped drain regions;

step 2, forming a gate dielectric layer on the surface of the semiconductor substrate;

step 3, growing a gate conductive material layer on a surface of the gate dielectric layer; performing a first patterning on the gate conductive material layer to form side faces on the gate conductive material layer and a segmentation trench on each side; and dividing the gate conductive material layer into a body gate conductive material layer and two edge gate conductive material layers along a channel length direction, wherein the body gate conductive material layer is located in a middle region, the two edge gate conductive material layers are located on two sides of the body gate conductive material layer, and wherein the two edge gate conductive material layers each is spaced apart from the body gate conductive material layer by the segmentation trench;

wherein a first side face and a second side face of the gate conductive material layer are outer surfaces of the edge gate conductive material layers and located along the channel length direction;

wherein the lightly doped drain regions extend under the first side face and the second side face of the gate conductive material layer, to reach under the body gate conductive material layer, such that the channel region becomes located under the body gate conductive material layer; and wherein the edge gate conductive material layers become located above the lightly doped drain regions;

step 4, forming spacers on side faces of the gate conductive material layer;

step 5, filling each segmentation trench with a dielectric segmentation structure, wherein forming the dielectric segmentation structure comprises forming a first dielectric layer of the spacers, wherein the first dielectric layer does not fully fill the segmentation trench and leaves a gap in the segmentation trench; and forming a second dielectric layer to fill the gap of the segmentation trench; wherein the first dielectric layer and the second dielectric layer are stacked in the segmentation trench; and step 6, forming source drain implantation regions in a self-aligned process on surfaces of the lightly doped drain regions outside the spacers away from the first side face and the second side face of the gate conductive material layer.

2. The method for manufacturing the MV device according to claim 1, wherein, in step 5, the first dielectric layer is made in a same process as the spacers are made in step 4.

3. The method for manufacturing the MV device according to claim 2, wherein a width of the segmentation trench is less than or equal to twice a thickness of a bottom of the spacer, and wherein the first dielectric layer fills the segmentation trench to form the dielectric segmentation structure, and wherein step 4 and step 5 are implemented together.

4. The method for manufacturing the MV device according to claim 2, wherein a width of the segmentation trench is greater than twice a thickness of a bottom of the spacer.

5. The method for manufacturing the MV device according to claim 1, wherein the forming the second dielectric layer in step 5 is implemented after step 6, and wherein the method further comprises fully filling the gap of the segmentation trench with a photoresist before step 6, and then performing step 6, followed by removing the photoresist from the segmentation trench.

6. The method for manufacturing the MV device according to claim 1, wherein the first dielectric layer comprises an oxide layer, or a nitride layer, or a stack layer of an oxide layer and a nitride layer; and wherein the second dielectric layer comprises an oxide layer, or a nitride layer, or a stack layer of an oxide layer and a nitride layer.

7. The method for manufacturing the MV device according to claim 1, wherein a material of the gate dielectric layer comprises an oxide layer.

8. The method for manufacturing the MV device according to claim 1, wherein a material of the gate conductive material layer comprises polysilicon.

* * * * *